(12) United States Patent
Comaskey et al.

(10) Patent No.: US 7,633,980 B1
(45) Date of Patent: Dec. 15, 2009

(54) PHASE CHANGE BASED COOLING FOR HIGH BURST MODE HEAT LOADS WITH TEMPERATURE REGULATION ABOVE THE PHASE CHANGE TEMPERATURE

(75) Inventors: Brian J. Comaskey, Walnut Creek, CA (US); George F. Albrecht, Livermore, CA (US); Karl F. Scheibner, Livermore, CA (US); Earl R. Ault, Livermore, CA (US); Hubert Joachim Vollmer, Tracy, CA (US); J. Philip Brady, Jr., Livermore, CA (US)

(73) Assignee: The United States of America as represented by the United States Department of Energy, Washington, DC (US)

( * ) Notice: Subject to any disclaimer, the term of this patent is extended or adjusted under 35 U.S.C. 154(b) by 96 days.

(21) Appl. No.: 12/039,766

(22) Filed: Feb. 29, 2008

(51) Int. Cl.
*H01S 3/04* (2006.01)
(52) U.S. Cl. .......................... 372/35; 372/34
(58) Field of Classification Search ............ 372/34, 372/35; 361/38; 310/52
See application file for complete search history.

(56) References Cited

U.S. PATENT DOCUMENTS

| | | | |
|---|---|---|---|
| 4,294,078 A | 10/1981 | MacCracken | |
| 5,526,372 A | 6/1996 | Albrecht et al. | |
| 6,170,561 B1 | 1/2001 | O'Grady | |
| 6,178,770 B1 | 1/2001 | Bradley et al. | |
| 6,239,502 B1 | 5/2001 | Grewe et al. | |
| 6,307,871 B1 | 10/2001 | Heberle | |
| 6,341,498 B1 | 1/2002 | DiFoggio | |
| 6,351,478 B1 | 2/2002 | Heberle | |
| 6,354,370 B1 | 3/2002 | Miller et al. | |
| 6,438,151 B1 | 8/2002 | Ault et al. | |
| 6,515,383 B1* | 2/2003 | Ognibene et al. | 310/52 |
| 6,570,895 B2* | 5/2003 | Heberle | 372/34 |
| 6,571,569 B1 | 6/2003 | Rini et al. | |
| 7,032,398 B2* | 4/2006 | Dilk et al. | 62/235 |
| 7,043,934 B2* | 5/2006 | Radermacher et al. | 62/285 |
| 7,363,772 B2* | 4/2008 | Narayanamurthy | 62/333 |

* cited by examiner

*Primary Examiner*—Minsun Harvey
*Assistant Examiner*—Tuan N. Nguyen
(74) *Attorney, Agent, or Firm*—Fred A. Lewis; James C. Durkis; Paul A. Gottlieb

(57) ABSTRACT

An apparatus and method for transferring thermal energy from a heat load is disclosed. In particular, use of a phase change material and specific flow designs enables cooling with temperature regulation well above the fusion temperature of the phase change material for medium and high heat loads from devices operated intermittently (in burst mode). Exemplary heat loads include burst mode lasers and laser diodes, flight avionics, and high power space instruments. Thermal energy is transferred from the heat load to liquid phase change material from a phase change material reservoir. The liquid phase change material is split into two flows. Thermal energy is transferred from the first flow via a phase change material heat sink. The second flow bypasses the phase change material heat sink and joins with liquid phase change material exiting from the phase change material heat sink. The combined liquid phase change material is returned to the liquid phase change material reservoir. The ratio of bypass flow to flow into the phase change material heat sink can be varied to adjust the temperature of the liquid phase change material returned to the liquid phase change material reservoir. Varying the flowrate and temperature of the liquid phase change material presented to the heat load determines the magnitude of thermal energy transferred from the heat load.

17 Claims, 3 Drawing Sheets

PHASE CHANGE BASED COOLING FOR HIGH BURST MODE HEAT LOADS WITH TEMPERATURE REGULATION ABOVE THE PHASE CHANGE TEMPERATURE

STATEMENT REGARDING FEDERALLY SPONSORED RESEARCH OR DEVELOPMENT

The United States Government has rights in this invention pursuant to Contract No. W-7405-ENG-48 between the United States Department of Energy and the University of California for the operation of the Lawrence Livermore National Laboratory.

BACKGROUND OF THE INVENTION

1) Field of the Invention

The present invention relates generally to a temperature regulated cooling system for medium to high average power heat loads, and particularly to a cooling system which utilizes a phase change material to cool these heat loads.

2) Description of Related Art

U.S. Pat. Nos. 6,307,871; 6,351,478; 6,570,895 by Heberle, disclose heat sink assemblies that include heat exchanges with extending surfaces in intimate contact with phase change material.

U.S. Pat. No. 6,354,370 by Miller et al, discloses an open loop liquid spray phase-change cooling system for a laser.

U.S. Pat. No. 6,571,569 by Rini et al, discloses a method and apparatus wherein the coolant to which the heat is transferred can be sprayed onto a surface which is in thermal contact with the heat source, such that the coolant sprayed onto the surface in thermal contact with the heat absorbs heat from the surface and carries the absorbed heat away as the coolant leaves the surface.

Continuous operation of medium to high average power lasers has spurred the development of a class of cooling systems utilizing heat exchangers, water flow loops, and refrigeration units. Characteristically, such cooling systems can add significantly to the overall laser systems' mass, size, and average power consumption. The need to provide cooling to a class of high power lasers that operate only intermittently ("burst mode") but require minimal mass, size and power consumption has sparked development of alternate cooling systems. Such systems have recognized the benefits of uncoupling the heat removal stage (from the heat load), from the heat elimination stage (from the heat sink). Many of these large lasers are pumped by banks of laser diodes. These laser diode banks must not only be cooled but must be thermally maintained to within about a degree (C) of their optimum operating temperature.

Besides lasers operated in burst mode, other applications exist wherein significant heats are generated when a device is operated intermittently (burst mode), and space/size constraints restrict cooling options. Such non-laser systems include but are not limited to heat loads from fighter plane avionics (radar, targeting and firing electronics, communications jamming systems, etc.). Thermal loads from fighter plane avionics are currently transferred to the craft's fuel, limiting sortie times, or to system to air heat exchangers which negatively impact combat flight characteristics in the form of air drag.

U.S. Pat. No. 5,526,372 by Albrecht et al discloses a method for operating a laser, wherein the waste heat is stored in the lasing medium itself. This approach utilized the inherent heat capacity characteristics of the medium (heat energy stored equals specific heat times the change in temperature).

Cooling systems that utilize phase change materials take advantage of the latent heat able to be absorbed when the material changes phase. Phase change materials provide a much higher thermal energy sink per unit mass and per unit volume of material than the simple heat capacity approach of U.S. Pat. No. 5,526,372 and permits the cooling of a wider range of laser media such as laser diodes and gas media. Since the phase change occurs at a constant temperature, some systems take advantage of this to maintain an interface at the phase change temperature. One downside is that one is limited to the phase change temperature for the specific phase change material, requiring a different phase change material or use of multiple phase change materials if different temperatures are desired. Another serious disadvantage of such an approach is that for high heat transfers with the liquid near the heat of fusion temperature, by definition, the temperature differential between the liquid and the solid phase heat sink is small. Since heat transfer is directly proportional to the temperature differential, on a per unit area basis, this would be a low performance heat exchanger. For high heat loads, such a device would have to be very large and bulky to offer the needed surface area. Also, in systems wherein the heat is transferred via fluid flowing through tubes embedded in the phase change material, the temperature of the solid phase change material surrounding the tubes initially increases (sensible heating) until the phase change temperature is reached. As the phase change material changes from solid to liquid, the vicinity surrounding the tubes begins to be filled with liquid phase change material. At some point the temperature of the liquid phase change material begins to rise due to sensible heating. In other words, over time the operating temperature will rise due to an inherent increase in the thermal impedance of the heat exchanger. Thus, it would be desirable to have a system that mitigates these changes in temperature.

BRIEF SUMMARY OF THE INVENTION

An object of the present invention is to provide an apparatus capable of transferring thermal energy from medium to high heat loads, particularly when the heat loads arise from burst mode (intermittent) operation. Another object is to provide a cooling apparatus wherein the medium to high heat loads are from lasers or flight avionics. Another object is to provide a cooling system using a phase change material. Another object is to provide a cooling system wherein the temperature of the heat transfer fluid presented to the heat load is independent of the phase change material transition temperature. Another objective is that the heat transfer fluid be temperature regulated which would result in the heat source being temperature regulated for a fixed flow rate.

In the present invention, thermal energy is transferred from a heat load to phase change material in liquid form from a liquid phase change material reservoir. The heated liquid phase change material is split into two flows. The first flow is directed to a phase change material heat sink where it comes into contact with the same phase change material in solid phase. Thermal energy is transferred to the solid phase change material causing the solid phase change material to melt (latent heating). The first flow of liquid phase change material is cooled as it transfers thermal energy to the solid phase change material (latent heating), and as it mixes with the solid phase change material (sensible heating). The second flow bypasses the phase change material heat sink and joins with cooled liquid phase change material exiting from the phase change material heat sink. The combined liquid phase change material is mixed to bring it to a uniform target temperature before it is returned to the liquid phase change material reservoir. The bypass ratio (ratio of bypass flow to flow into the phase change material heat sink) can be varied to adjust and regulate the temperature of the liquid form of the phase change material in the reservoir. By temperature regulating the liquid in the reservoir, for any constant flow rate, a constant heat load source will in turn be thermally regulated. Further, one can set the temperature of the liquid to many degrees (C) above the melting temperature of the phase change material. It should be noted that the rate of heat flow at the liquid phase change material to solid phase change material interface is directly proportional to the difference in temperature between the flowed liquid phase change material and the solid phase change material. Thus, the size (surface area of solid phase change material) of the liquid solid phase change material heat exchange can be greatly reduced compared to systems running the liquid phase change material at the melting temperature of the solid phase change material.

BRIEF DESCRIPTION OF THE SEVERAL VIEWS OF THE DRAWING

In the figures, like or similar elements (such as phase change material heat sink 18) utilize the same reference characters throughout the various views.

DETAILED DESCRIPTION OF THE INVENTION

| Acronyms | |
| --- | --- |
| BPCM | Bulk Phase Change Material |
| HTM | Heat Transfer Means |
| LPCM | Phase Change Material in liquid phase |
| PCM | Phase Change Material |
| PCMHS | Phase Change Material Heat Sink |
| SPCM | Phase Change Material in solid phase |

Figure 1:
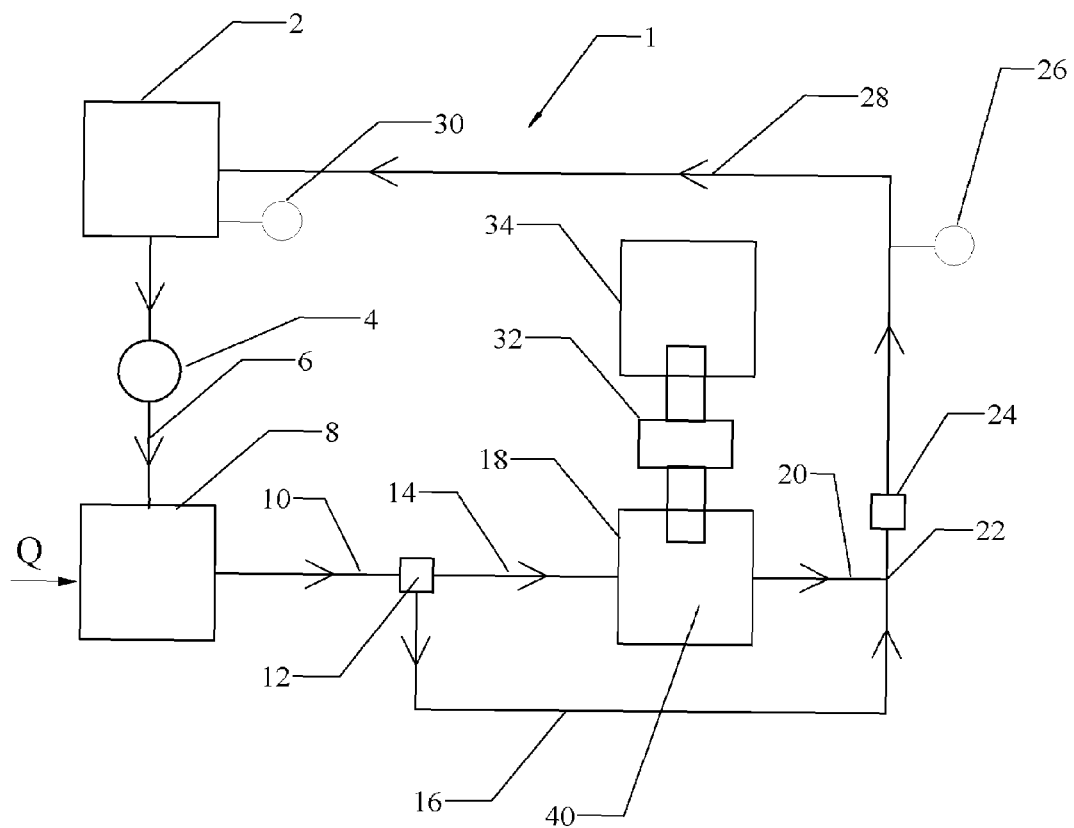
FIG. 1 illustrates a diagrammatic view of one embodiment of the present invention.

A first embodiment for a cooling system 1 to remove thermal energy from a heat load (not shown) according to the present invention is described hereunder with reference to FIG. 1. Liquid phase change material (LPCM) 6 is delivered (via pump 4) from LPCM reservoir 2 at temperature Tset to a heat transfer means (HTM) 8 wherein the LPCM heats up to temperature T1 due to thermal heat load (absorbed power) Q. T1 is a temperature elevated over the melting temperature of the solid phase change material. Higher T1 values result in smaller surface areas for the solid phase change material in order to meet the heat transfer requirements. Heated LPCM material 10 exits from HTM 8 to flow bypass means 12 wherein the flow is split into a first flow fraction 14, and a bypass flow fraction 16. First flow fraction 14 enters phase change material heat sink (PCMHS) 18 containing bulk phase change material (BPCM) 40 (comprising the same phase change material as LPCM 6 but in the form of both LPCM and SPCM) where it transfers thermal energy to BPCM 40 primarily by melting SPCM and secondarily by raising the temperature of the resulting added LPCM. Cooled LPCM fraction 20 (at temperature T2 which is less than Tset) is combined with bypass flow fraction 16 (still at temperature T1, having bypassed PCMHS 18) at junction 22. Combined LPCM 28 is mixed at flow mixer 24 to a uniform temperature Tmix and continues back to LPCM reservoir 2. One or more temperature sensors (e.g. 26 and 30) monitor the temperature of the liquid phase change material at one or more points in the system to provide feedback to a control system (not shown) to actively adjust the ratio of bypass flow fraction 16 to first flow fraction 14 such that Tmix equals Tset to high tolerance. For any given flow rate, if Tset is maintained to high tolerance, then the heat source that supplies the heat Q to the HTM 8 will in turn be well thermally regulated. Increasing the bypass ratio increases Tset and hence T1. This results in the heat source temperature operating point moving up in kind. A higher T1 also results in a more compact PCMHS 18 due to higher heat transfer per unit area of solid phase change material. In a further embodiment, solid BPCM is reconstituted in PCMHS 18 (in situ) by heat transfer means 32 which transfers thermal energy from BPCM 40 in PCMHS 18 to heat sink 34. In another embodiment, solid BPCM is reconstituted in a separate unit (off line) and loaded into the PCMHS 18 before initiation of thermal energy removal from the heat load. It is to be understood that in various embodiments, the functions of junction 22 and flow mixer 24 may be implemented via separate components or by one component.

Figure 2A:
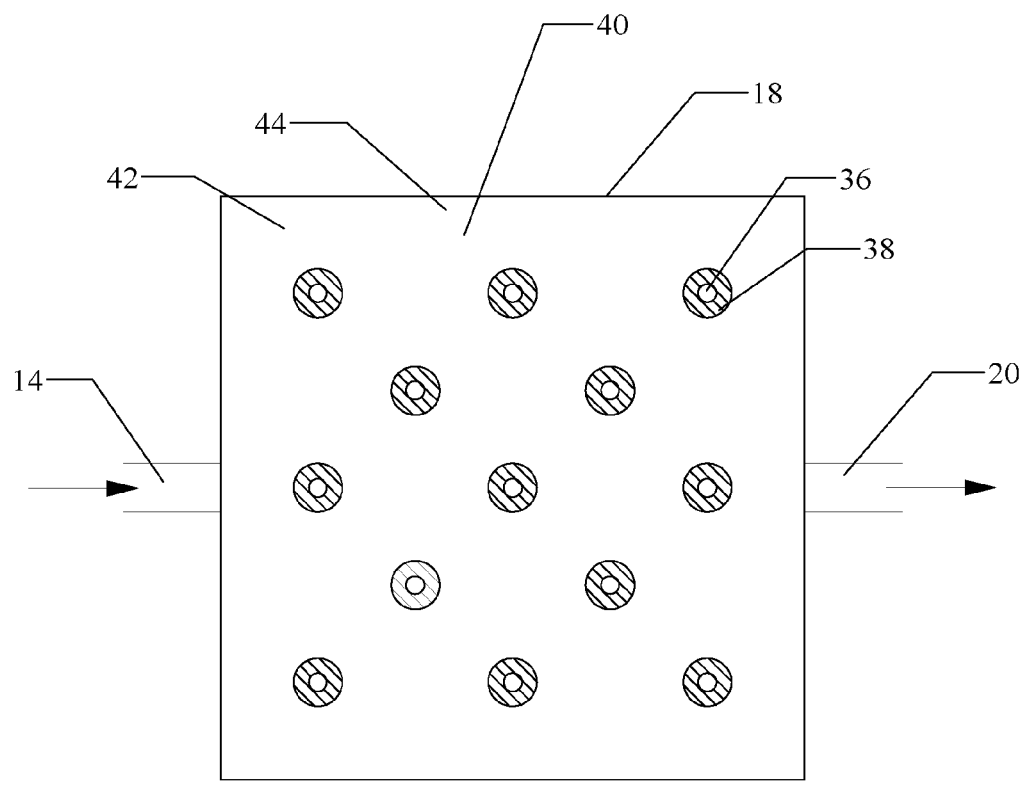
FIGS. 2A and 2B illustrate an embodiment of the phase change material heat sink component.

Referring to FIGS. 2A (top view) and 2B (side view), flow fraction 14 enters PCMHS 18 where it contacts and transfers thermal energy to the lower temperature BPCM 40 (with BPCM 40 comprising solid phase change material (SPCM) 44 and liquid phase change material (LPCM) 42). At the beginning of the heat load thermal energy removal phase, the ratio of SPCM 44 to LPCM 42 is high. At the beginning of the heat load thermal energy removal phase, the temperature of LPCM 42 would be at the liquid/solid transition temperature. The quantity of BPCM 40 in solid phase is determined by matching the total latent heat of fusion of the solid to the time integrated thermal energy removed from the heat load (such as from a given burst mode task). The transfer of thermal energy from flow fraction 10 to SPCM 44 causes portions of the SPCM 44 to melt. Flow fraction 14 mixes and exchanges heat with liquid phase change material LPCM 42 at heat of fusion temperature resulting from this melting causing further cooling. Cooled LPCM fraction 20 exits from PCMHS 18. Cooling operation of this device may continue as long as SPCM 44 remains in PCMHS 18. SPCM reconstitution may occur by various means. In certain embodiments, refrigerant 36 flows through a plurality of tubes 38 which are in thermal contact with BPCM 40, to remove thermal energy from BPCM 40 resulting in cooling and ultimate resolidification of SPCM 44 about tubes 38. Refrigerant 36 interfaces with heat transfer means 32 which transfers thermal energy from refrigerant 36 to heat sink 34. In certain embodiments, the resolidification system is integral with the PCMHS 18. The resolidification cooling capacity is sized to match the time between burst mode (intermittent) operation of the device. In other embodiments, the SPCM is reconstituted in a separate component, with the SPCM loaded into the PCMHS 18 prior to operation. In certain embodiments, SPCM 44 comprises multiple pieces (e.g. rods or blocks) of solid PCM. LPCM 42 fills the interstitial spaces and spaces surrounding SPCM 44. Having multiple pieces of solid PCM offers more exposed surface area and permits high velocity flow through the structure. In other embodiments, SPCM 44 is a monolithic structure so configured with internal fluid (such as water) channels to offer high exposed surface area and high coolant flow velocities.

In one embodiment of the present invention, thermal energy is removed from the heat load during a time period (heat load cooling phase) that is separate from the time period (BPCM cooling/resolidification phase) when thermal energy is removed from the BPCM 40 in the PCMHS 18 to cool and resolidify the BPCM 40. In another embodiment, the heat load cooling phase is simultaneous with a BPCM cooling phase, wherein the amount of thermal energy removed from the BPCM 40 is less than the thermal energy removed from the heat load, resulting in partial melting of the BPCM 40. Upon cessation of the heat load cooling phase, the BPCM resolidification phase is initiated to resolidify the BPCM 40. In a further embodiment, the BPCM cooling phase is not initiated until a period of time after initiation of the heat load cooling phase.

Figure 3:
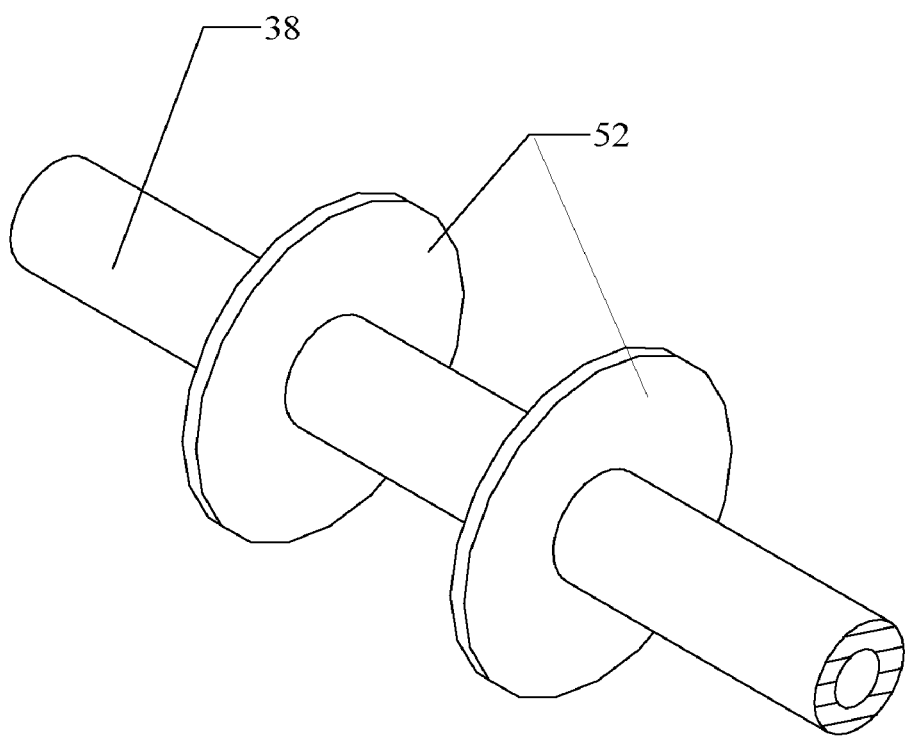
FIG. 3 illustrates an embodiment of a phase change material heat sink tube through which refrigerant flows to remove thermal energy from the liquid phase change material in the heat sink in order to restore the solid phase change material for another burst mode operation.

Referring to FIG. 3, an embodiment of refrigerant tube 38 is illustrated, having one or more radial protrusions 52 to improve ice retention/grip with tube 38. It is to be understood that although tube 38 and radial protrusions 52 are shown with round cross-sections, other cross-section shapes may be used. Tube 38 may be implemented without radial protrusions 52.

Phase Change Material (PCM)

In one embodiment of the present invention, the phase change material (PCM) is water. In a further embodiment, the phase change material is water containing one or more dissolved salts to adjust the freezing temperature of the water. A lower liquid/solid transition temperature would permit higher thermal energy transfer rates. The salt concentration would have to be monitored and adjusted due to the expected changes in salt concentration due to the liquid solid transitions. High ion concentrations would urge greater care in selection of materials due to greater corrosion potential, and may be precluded in applications requiring non-electrically conductive coolants. In another further embodiment, the phase change material is water mixed with antifreeze (e.g. ethylene glycol or propylene glycol) to modify the freezing and boiling temperatures of the fluid. In addition to the higher potential thermal energy transfer rates, use of antifreeze may be advantageous where there is potential for the heated liquid phase change material to approach the phase change material's liquid/vapor transition temperature. Other materials having chemical stability in the liquid and solid phases may be selected as the PCM in the present invention. Selection of a PCM is determined by the expected operating temperature $T_{oper}$ for the PCM in liquid phase. A preferred PCM would be one having a solid/liquid transition temperature that is significantly lower than $T_{oper}$, and a liquid/vapor transition temperature that is significantly higher than $T_{oper}$.

Heat Transfer Means

Heat transfer means 8 may comprise any of various means well known to those skilled in the art suitable for transferring thermal energy from the heat load to the liquid phase change material 6. Such heat transfer means include but are not limited to heat exchangers and thermoelectric devices.

Figure 2B:
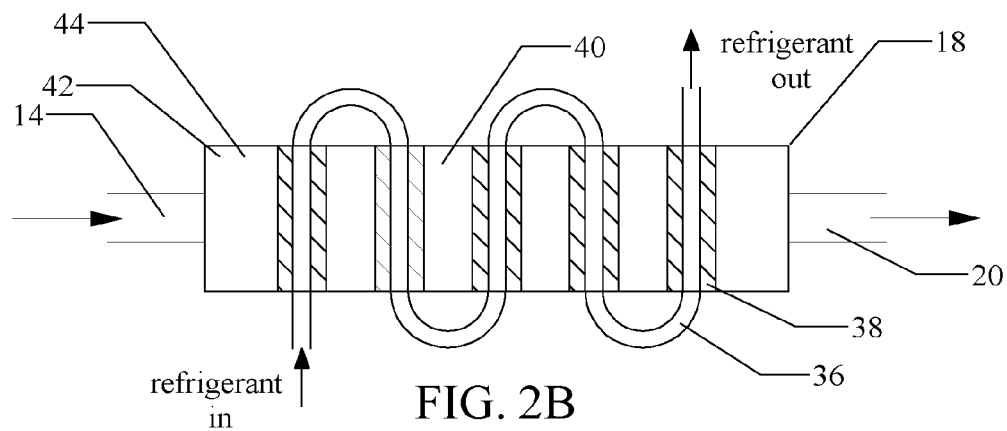

Heat transfer means 32 may comprise any of various means well known to those skilled in the art suitable for transferring thermal energy from the bulk phase change material 40 in the phase change material heat sink 18 to heat sink 34. Such heat transfer means include but are not limited to heat exchangers and thermoelectric devices. Referring to FIG. 2, in one embodiment, heat transfer means 32 comprises a plurality of tubes 38 (through which heat transfer fluid 36 flows) embedded in BPCM 40, with thermal energy from heat transfer fluid 36 transferred to heat sink 34 by means well known to those skilled in the art. In another embodiment, heat transfer means 32 comprises a thermoelectric device which transfers thermal energy from panels in direct contact with BPCM 40, to heat sink 34. It should be understood that heat transfer means 32 may comprise a series of heat transfer devices to accomplish transfer of thermal energy to heat sink 34. Heat sink 34 may comprise the ambient environment or may comprise a secondary material to store the thermal energy as sensible heat, latent heat or combination of the foregoing. Heat transfer mechanisms for transferring thermal energy to heat sink 34 may comprise conduction, convection, radiation, and any combination of the foregoing, as would be well known to those skilled in the art.

Heat Load

The heat load may be derived from various sources. In one embodiment, the heat load is the waste heat from medium to high power lasers operated in burst mode. In another embodiment the heat load is the waste heat from massive banks of laser diodes operated in the burst mode. In another embodiment, the heat load is waste heat from electronics, such as from fighter plane avionics or satellite systems. Such electronics would include but not limited to: radars, targeting and/or firing electronics, communication jamming systems, communications systems. on-board computers and telemetry. It is to be understood that the heat load is not limited to these exemplary heat loads, but may include any and all heat loads requiring the magnitude of thermal energy transfer provided by the inventive apparatus.

Flow Bypass Means

Flow bypass means 12 may be selected from various means that would be well known to those skilled in the art. Such means would include but not limited to one or more proportional control flow valves selected to vary the bypass ratio.

EXAMPLE 1

A 100 kW diode pumped laser operating for 26 seconds in burst mode generates a 622 kW heat load. Coolant temperature is 30 deg C., flow rate of 19 kg/sec. A cooling system sized to meet this heat load would comprise 40 kg of 30 deg C. water in the water reservoir, flowing at 19 kg/sec. The ice heat sink is sized for a volume of 126 liters, with 100 kg of ice and water at O deg C. Splitting of the water flow between flow to the ice heat sink and bypass water flow is accomplished via a standard off the shelf proportional control flow valve.

EXAMPLE 2

The same fact pattern as Example 1, further comprising a refrigeration unit to reconstitute ice in-situ.

Obviously numerous modifications and variations of the present invention are possible in the light of the above teachings. It is therefore to be understood that within the scope of the appended claims the invention may be practiced otherwise than as specifically described therein.

What is claimed is:

1. An apparatus for transferring thermal energy from a heat load, the apparatus comprising:
   a reservoir of phase change material in liquid phase (LPCM);
   means for delivering LPCM from said LPCM reservoir to said heat load;
   heat transfer means (HTM) for transferring thermal energy from said heat load to said delivered LPCM, said heat load HTM having an inlet to receive said delivered LPCM and an outlet to discharge said heated LPCM;

means for splitting said discharged heated LPCM into a first LPCM flow and a bypass LPCM flow;

a phase change material heat sink (PCMHS) containing bulk phase change material (BPCM), said BPCM comprising phase change material in solid form (SPCM) and in liquid form (LPCM), and comprising the same phase change material as said delivered LPCM, said PCMHS having an inlet to receive said first LPCM flow, said PCMHS adapted to direct said first LPCM flow into contact with said solid phase change material (SPCM) wherein thermal energy transferred from said first LPCM flow to said SPCM causes latent heating of said SPCM resulting in melting of at least a portion of said SPCM, first LPCM flow mixing with said PCMHS LPCM resulting in cooled LPCM, said PCMHS having an outlet to discharge at least a portion of said cooled LPCM;

means for combining said discharged LPCM with said bypass LPCM flow, means for mixing said portion of cooled LPCM with said bypass LPCM to result in LPCM at a uniform temperature;

and means for returning said uniform temperature LPCM to said LPCM reservoir.

2. The apparatus according to claim 1 wherein:
said delivered LPCM is at a temperature Tset;
said uniform temperature LPCM is at a temperature Tmix;
and further comprising:
a control system which adjusts the ratio of first LPCM flow to bypass LPCM flow such that Tmix is substantially equal to Tset.

3. The apparatus according to claim 1 further comprising:
heat transfer means (HTM) for transferring thermal energy from said bulk phase change material (BPCM) to a heat sink.

4. The apparatus according to claim 3 wherein:
said bulk phase change material (BPCM) heat transfer means (HTM) results in resolidification of solid phase change material (SPCM) in said phase change material heat sink (PCMHS).

5. The apparatus according to claim 1 wherein:
said heat load is selected from the list consisting of laser systems and avionics.

6. The apparatus according to claim 1 wherein:
said heat load heat transfer means is selected from the list consisting of heat exchangers, thermoelectric devices, and combinations of the foregoing.

7. The apparatus according to claim 1 wherein:
said phase change material is water.

8. The apparatus according to claim 7 wherein:
said phase change material is water containing at least one additional substance,
said additional substance serving to modify the properties of the water with said properties selected from the list consisting of melting temperature, boiling temperature and combination of the foregoing,
said additional substance selected from the list consisting of dissolved salts and antifreeze.

9. The apparatus according to claim 8 further comprising:
heat transfer means (HTM) for transferring thermal energy from said ice and water in said ice heat sink to a heat sink, resulting in resolidification of ice in said ice heat sink.

10. An apparatus for transferring thermal energy from a laser system, the apparatus comprising:
a reservoir of water;
means for delivering water from said water reservoir to said heat load HTM;
heat transfer means (HTM) for transferring thermal energy from said laser system to said delivered water, said heat load HTM having an inlet to receive said delivered water at temperature Tset, and an outlet to discharge said heated water;
means for splitting said discharged heated water into a first water flow and a bypass water flow;
an ice heat sink containing ice and water,
said ice heat sink having an inlet to receive said first water flow,
said ice heat sink adapted to direct said first water flow into contact with said ice wherein thermal energy transferred from said first water flow to said ice causes latent heating of said ice resulting in melting of at least a portion of said ice,
said first water flow mixing with said ice heat sink water resulting in cooled water,
said ice heat sink having an outlet to discharge at least a portion of said cooled water;
means for combining said discharged water with said bypass water flow;
means for mixing said combined water to result in water at a uniform temperature Tmix;
and a control system which adjusts the ratio of first water flow to bypass water flow such that Tmix is substantially equal to Tset.

11. A method of transferring thermal energy from a heat load, the method comprising:
delivering liquid phase change material (LPCM) from an LPCM reservoir to said heat load;
transferring thermal energy from said heat load to said LPCM from said LPCM reservoir resulting in heated LPCM;
splitting said heated LPCM into a first LPCM flow and a bypass LPCM flow;
directing said first LPCM flow into contact with bulk phase change material (BPCM) in a phase change material heat sink (PCMHS),
said BPCM comprising phase change material in solid phase (SPCM) and in liquid phase (LPCM), and comprising the same phase change material as said delivered LPCM,
wherein thermal energy transferred from said first LPCM flow to said SPCM causes latent heating of said SPCM resulting in melting of at least a portion of said SPCM,
said first LPCM flow mixing with said PCMHS LPCM resulting in cooled LPCM,
discharging at least a portion of said cooled LPCM;
combining said discharged LPCM with said bypass LPCM flow;
mixing said combined LPCM to result in LPCM at a uniform temperature.

12. The method according to claim 11 wherein:
said delivered LPCM is at a temperature Tset;
said uniform temperature LPCM is at a temperature Tmix;
and further comprising:

adjusting the ratio of first LPCM flow to bypass LPCM flow such that Tmix is substantially equal to Tset.

13. The method according to claim 11 wherein:
said phase change material is water.

14. The apparatus according to claim 11 wherein:
said heat load is selected from the list consisting of laser system and avionics.

15. The method according to claim 11 further comprising:
transferring thermal energy from said bulk phase change material to a heat sink.

16. The method according to claim 15 wherein:
said transfer of thermal energy from said bulk phase change material results in resolidification of solid LPCM in said phase change material heat sink (PC-MHS).

17. The method according to claim 11 wherein:
said heat load heat transfer means is selected from the list consisting of heat exchangers, thermoelectric devices, and combinations of the foregoing.

* * * * *